United States Patent [19]
Lee

[11] Patent Number: 6,008,120
[45] Date of Patent: Dec. 28, 1999

[54] SILICON OXYNITRIDE CAP FOR FLUORINATED SILICATE GLASS FILM IN INTERMETAL DIELECTRIC SEMICONDUCTOR FABRICATION

[75] Inventor: Gill Yong Lee, Fishkill, N.Y.

[73] Assignee: Siemens Aktiengesellschaft, Munich, Germany

[21] Appl. No.: 09/204,031

[22] Filed: Dec. 1, 1998

Related U.S. Application Data

[62] Division of application No. 09/120,630, Jul. 22, 1998.
[51] Int. Cl.$^6$ .................................................. H01L 21/469
[52] U.S. Cl. ............................ 438/634; 438/624; 438/783
[58] Field of Search ........................................ 438/597, 624, 438/633, 636, 637, 634, 723, 945, 783

[56] References Cited

U.S. PATENT DOCUMENTS 5,872,065  2/1999  Sivaramakrishnan ................... 438/784

Primary Examiner—Caridad Everhart
Attorney, Agent, or Firm—Donald B. Paschburg

[57] ABSTRACT

A semiconductor device and method of forming a patterned conductive layer on a semiconductor substrate are provided so as to prevent fluorine substance outflow from a fluorinated silicate glass (FSG) layer thereon and simultaneously so as to suppress back reflection of light waves into a photoresist layer during photolithographic processing. The substrate is coated in turn with a conductive layer, a dielectric (e.g., silicon dioxide) liner, a FSG layer, a silicon oxynitride layer preventing fluorine substance outflow therethrough from the FSG layer and also forming an antireflective coating (ARC), and a photoresist layer. The photoresist layer is exposed and developed to uncover pattern portions of the underlying silicon oxynitride layer. The uncovered pattern portions of the silicon oxynitride ARC layer and corresponding underlying portions of the FSG layer and dielectric liner are then removed, e.g., by a single dry etching step, to expose pattern portions of the conductive layer for metallization. Upon metallization, the substrate is provided with a combination of the FSG layer and silicon oxynitride layer, in which the silicon oxynitride layer prevents fluorine substance outflow therethrough from the underlying FSG layer to an overlying conductive layer.

16 Claims, 2 Drawing Sheets

SILICON OXYNITRIDE CAP FOR FLUORINATED SILICATE GLASS FILM IN INTERMETAL DIELECTRIC SEMICONDUCTOR FABRICATION

This is a divisional of application Ser. No. 09/120,630 Jul. 22, 1998 pending.

FIELD OF THE INVENTION

This invention relates to a semiconductor device that includes a silicon oxynitride cap for a fluorinated silicate glass (FSG) film in intermetal dielectric semiconductor fabrication, and more particularly to a stable combination arrangement of a FSG film covered by a silicon oxynitride cap layer on a semiconductor substrate, as well as to a method of manufacturing a semiconductor device that includes forming a patterned conductive, i.e., electrically conductive, layer on a semiconductor substrate with a FSG film combined with a silicon oxynitride cap layer for intermetal dielectric application.

BACKGROUND OF THE INVENTION

In the fabrication of microelectronic semiconductor devices on a wafer substrate, such as silicon, to form an integrated circuit (IC), various metal layers and insulation layers are deposited thereon in selective sequence. The insulation layers, e.g., of silicon dioxide, silicon oxynitride ($Sio_xN_y$), fluorinated silicate glass (FSG), also called fluorinated silicon oxide, spin-on glass (SOG), etc., serve as electrical insulation between metal layers, e.g., intermetal dielectric (IMD) layers, as protective layers, as gap filling layers to achieve planarization (layer flatness) in the wafer substrate, and the like, as the case may be. The individual layers are deposited by conventional technique such as plasma enhanced chemical vapor deposition (PECVD), atmospheric pressure CVD, etc.

Typically, a first level metal layer, e.g., disposed on a silicon substrate containing devices, is separated by one or more insulation layers from a second level metal layer thereabove. This in turn may be separated by one or more further insulation layers from a third level metal layer thereabove, etc. These metal layers are interconnected by metallization through vias or small holes or apertures etched in the intervening insulation layers.

For this purpose, the stacked layers undergo photolithographic processing to provide a pattern thereon consonant with the IC design, e.g., to form vias. The top layer on the wafer substrate is covered with a photoresist layer of photo-reactive polymeric material for patterning via a mask. Light such as visible or ultraviolet (UV) light is directed through the mask onto the photoresist layer to expose it in the mask pattern. The polymeric material of the photoresist layer is transparent to the light yet photo-reactive to change its chemical properties, i.e., by photo-initiated reaction, thereby permitting its patterning.

An antireflective coating (ARC) layer such as an organic ARC layer, e.g., of light absorbing polymer, such as polyimide, is usually provided at the top portion of the wafer substrate to minimize reflection of light back to the photoresist layer for more uniform processing.

The photoresist may be of negative or positive type. In a negative photoresist, the exposed (polymerized) areas become insoluble while the unexposed (unpolymerized) areas dissolve in a later applied developer liquid. In a positive photoresist, the exposed (degraded) soluble areas dissolve in the developer liquid while the unexposed (insoluble) areas remain. In both instances, the photoresist material remaining on the wafer substrate forms the pattern to serve as a mask for etching in turn of the pertinent layers.

Where a layer material is of different physical and chemical characteristics from that of adjacent layers, its etching process is also different therefrom, e.g., in forming vias in dielectric layers to connect neighboring level metal layers. The etching is desirably anisotropic (high rate vertical direction etching and low rate or inhibited horizontal direction etching), as distinguished from isotropic (etching the exposed surfaces equally in all directions), for providing an etched structure of uniform vertical wall geometry or profile. Etching may be effected by wet etching (solution) or dry etching (plasma etching or reactive ion etching) technique, depending on the physical and chemical characteristics of the material being etched and of the neighboring material.

For maximizing the integration (connection) of device components in the available area on the wafer substrate to fit more components in the same area, increasing miniaturization is required. As narrower metal lines and closer pitch dimensions are needed to achieve increasingly dense packing of the components, they become more vulnerable to defects at the minute tolerances involved. This has become apparent as IC miniaturization has increased to what is now called very large scale integration (VLSI) at sub-quarter micron (0.25 micron, i.e., 250 nanometer (nm) or 2,500 angstrom), or less, dimensions.

By comparison, visible light has a wavelength spectrum of 400–700 nm (4,000–7,000 angstroms), and UV light has a wavelength spectrum of 100–400 nm (1,000–4,000 angstroms). Generally, mid UV (MUV) light has a wavelength of about 365 nm, while deep UV (DUV) light has a wavelength of about 248 nm or less.

At sub-quarter micron sizes, the desired high aspect ratios (depth to width) associated with photolithographic processing to form apertures or windows, fine conductive lines, etc., in various layers of the wafer substrate, require very strict tolerances to prevent undesired defects such as touching of closely spaced apart components that can cause short circuiting, etc.

During travel of the mask patterned incident light from the radiation source through the photo-reactive polymeric material of the photoresist layer, it is progressively absorbed as it photo-initiates reaction in the exposed pattern areas. As some incident light reaching the ARC layer is not absorbed thereby, but rather is reflected and scattered back into the photoresist layer, there is interference with the incident light and formation of standing waves.

Contaminants that are incompatible with the photoreactive polymeric material can migrate into the photoresist layer from the ARC layer or other vicinal layer. These contaminants can poison the photoresist layer, e.g., undergo interfering reactions therewith, causing non-uniformity of the reaction therein by extraneous chemical interaction with the polymeric material. This is commonly called photoresist poisoning.

These influences lead to formation of a photoresist footing where a positive photoresist is used, or of a photoresist pinching where a negative photoresist is used. Specifically, upon development, the exposed pattern areas of the photoresist layer have a photoresist profile or structure with non-uniform (non-vertical) side walls. After etching, the photoresist footing or photoresist pinching problem leads to imperfect transfer of the photoresist pattern to the underlying layer or layers, and ultimately limits the minimum spatial resolution since the etched structure is imprecise compared to the desired IC design.

FSG (fluorinated silicate glass) is one of the favorable low dielectric materials used for intermetal dielectric (IMD) application in sub-half micron (0.5 micron) semiconductor fabrication technology in connection with metallization techniques before so-called back end of the line operations (between metallization and sale). To deposit FSG, for example, either high density plasma (HDP) chemical vapor deposition (CVD) or plasma enhanced chemical vapor deposition (PECVD) is commonly used.

The dielectric constant achievable for FSG is about 3.3 depending on the fluorine concentration in the FSG film and the precursor used to deposit the FSG film. A higher fluorine concentration usually provides a lower dielectric constant. However, a higher fluorine concentration makes the film unstable because free fluorine tends to diffuse or migrate out of the film to adjacent layers in the IC.

Out diffusion of fluorine substances (including fluorine itself and attendant self-generating contaminant compounds thereof with other contaminating precursor constituents) from FSG can create bubbles that collect at interfaces with metal layers, resulting in metal peeling problems due to corrosion or poisoning, and the like. In many cases, FSG use is combined with post plasma treatment, e.g., plasma treatment using oxygen and nitrogen or nitrous oxide ($N_2O$), or the inclusion of a silicon dioxide cap layer to minimize fluorine substance out diffusion. However, fluorine substances, including fluorine itself, will diffuse well into silicon dioxide films and the diffusion length (penetration depth) thereof can be in excess of several thousand angstroms.

While the matter is not fully understood at this time, it is believed that contaminants such as hydrogen and nitrogen remain as precursor constituents in silicon dioxide based layers consequent their deposition, e.g., by PECVD technique, using silane ($SiH_4$) in the presence of oxygen, nitrogen, nitrous oxide, and the like. In the presence of fluorine, it is considered that self-generating contaminant compounds thereof are formed with attendant hydrogen and/or nitrogen and/or other species that remain as contaminating precursor constituents. It is believed that fluorine and such self-generating contaminant compounds out diffuse to collect at a vicinal metal layer interface to cause such corrosion or poisoning and metal peeling problems.

As used in the specification and claims, the term "fluorine substance" contemplates fluorine-containing substances including both free fluorine itself and attendant self-generating contaminant compounds thereof with other contaminating precursor constituents such as hydrogen and nitrogen (i.e., fluorine-containing contaminant compounds).

A typical semiconductor fabrication technique using FSG as a low dielectric material for IMD application includes the steps of:

(1) metal layer deposition and patterning on a wafer substrate;

(2) silicon dioxide liner deposition on the metal layer;

(3) FSG layer deposition on the silicon dioxide liner;

(4) silicon dioxide cap layer deposition on the FSG layer;

(5) chemical mechanical polishing (CMP) of the silicon dioxide cap layer;

(6) post CMP additional silicon dioxide cap layer deposition on the polished silicon dioxide cap layer (or post plasma treatment);

(7) organic ARC layer deposition on the additional silicon dioxide cap layer (or plasma treated layer);

(8) photoresist layer deposition on the organic ARC layer and photolithographic exposure and development;

(9) organic ARC layer open etching; and

(10) dielectric layer contact etching.

It is desirable to have an arrangement of FSG as an IMD in a semiconductor device in which out diffusion of fluorine substances is prevented so as to avoid metal peeling problems, especially if this is attained essentially without increasing the manufacturing costs.

SUMMARY OF THE INVENTION

The foregoing drawbacks are obviated in accordance with the present invention by providing a system of a fluorinated silicate glass (FSG) film (layer) combined with a silicon oxynitride ($SiO_xN_y$) cap layer for intermetal dielectric (IMD) application in semiconductor fabrication. The combining of the silicon oxynitride cap layer with the FSG layer increases the stability of the FSG layer and simultaneously provides a uniform reflectance control for contact lithography processing.

According to one aspect of the invention, a semiconductor device that includes a substrate is provided having a combination of a FSG layer, e.g., of about 1,000–10,000 angstroms thickness, and a silicon oxynitride cap layer, e.g., of about 100–1,000 angstroms thickness, thereon. The silicon oxynitride cap layer is disposed in overlying covering relation to the FSG layer sufficiently to prevent fluorine substance outflow therethrough from the FSG layer and to form an antireflective coating (ARC). A conductive layer, e.g., of a metal such as aluminum, tungsten or copper, is disposed in overlying relation to the silicon oxynitride cap layer. The silicon oxynitride cap layer is arranged relative to the underlying FSG layer and overlying conductive layer sufficiently to prevent fluorine substance outflow therethrough from the FSG layer to the conductive layer.

More particularly, the semiconductor device includes a substrate that has a patterned conductive layer, e.g., of a metal such as aluminum, tungsten or copper, thereon, a dielectric liner, e.g., an IMD liner of silicon dioxide, disposed on the patterned conductive layer, and a combination of a FSG layer and a silicon oxynitride cap layer disposed on the dielectric liner, the silicon oxynitride cap layer being disposed in overlying covering relation to the FSG layer. A further conductive layer, e.g., of a metal such as aluminum, tungsten or copper, is disposed in overlying relation to the silicon oxynitride cap layer and in conductive contact with the patterned conductive layer. In this combination, the silicon oxynitride cap layer is arranged relative to the underlying FSG layer and overlying further conductive layer sufficiently to prevent fluorine substance outflow therethrough from the FSG layer to the further conductive layer.

According to another aspect of the invention, a method is provided for forming a patterned conductive layer on a semiconductor substrate. It comprises providing a conductive layer, e.g., of aluminum, tungsten or copper, on a surface of a semiconductor substrate, a dielectric liner, e.g., an IMD liner of silicon dioxide, on the conductive layer, a FSG layer on the dielectric liner, and a silicon oxynitride layer on the FSG layer sufficient to prevent fluorine substance outflow therethrough from the FSG layer and to form an antireflective coating (ARC). A photoresist layer is provided on the silicon oxynitride layer. The photoresist layer is selectively exposed and developed to uncover selective pattern portions of the underlying silicon oxynitride layer. The pattern portions of the silicon oxynitride layer and corresponding underlying portions of the FSG and dielectric liner are removed to expose pattern portions of the conductive layer such as for metallization.

The uncovered pattern portions of the silicon oxynitride layer and corresponding underlying portions of the FSG layer and dielectric liner are desirably all removed together in an etching step such as a dry etching step, e.g., by contact etching in a single dry etching step using $CF_4$ (tetrafluoromethane) and argon gas per RIE (reactive ion etching).

A dielectric cap layer is preferably provided between the FSG and silicon oxynitride layers, e.g., in a thickness up to about 20,000 angstroms, for gap-filling, spacing and planarizing purposes. The dielectric cap layer is desirably polished, such as by a conventional chemical mechanical polishing (CMP) step, before the silicon oxynitride layer is provided thereon. The polished dielectric cap layer typically has a resultant thickness of about 0–20,000 angstroms. The uncovered pattern portions of the silicon oxynitride layer and corresponding underlying portions of the dielectric cap layer, FSG layer and dielectric liner are advantageously all removed together in the etching step.

Typically, the conductive layer is provided in a thickness of about 1,000–10,000 angstroms, the dielectric liner is provided in a thickness of about 100–2,000 angstroms, the FSG layer is provided in a thickness of about 1,000–10,000 angstroms, and the silicon oxynitride layer is provided in a thickness of about 100–2,000 angstroms.

In particular, the silicon oxynitride comprises $SiO_{0.5-1.5}N_{0.1-1.5}$.

The photoresist layer may be exposed to light irradiation at a wavelength of about 193–633 nm (UV and visible light). At said wavelength, the silicon oxynitride layer typically has a refractive index of about 1.60–3.6 and an extinction coefficient of about 0.01–2.0.

According to a preferred embodiment, the method comprises the steps of providing a conductive metal layer on a surface of a semiconductor substrate, a dielectric silicon dioxide liner on the conductive layer, a FSG layer on the dielectric liner, a dielectric silicon dioxide cap layer on the FSG layer, and a silicon oxynitride layer on the dielectric cap layer and in overlying relation to the FSG layer sufficient to prevent fluorine substance outflow therethrough from the FSG layer and to form an ARC. A photoresist layer is provided on the silicon oxynitride layer. Further steps comprise selectively exposing and developing the photoresist layer to uncover selective pattern portions of the underlying silicon oxynitride layer, and collectively removing together the uncovered pattern portions of the silicon oxynitride layer and corresponding underlying portions of the dielectric cap layer, FSG layer and dielectric liner in a single etching step to expose pattern portions of the conductive layer such as for metallization.

In particular, the dielectric cap layer is polished by a CMP step before the silicon oxynitride layer is provided thereon.

According to a preferred feature of the invention, a method of treating a wafer substrate in semiconductor fabrication is provided for preventing fluorine substance outflow from a FSG layer thereon to an overlying photoresist layer and simultaneously for suppressing reflection of light waves back into the photoresist layer during photolithographic processing of the photoresist layer to maximize uniformity of patterned light wave exposure and development of the photoresist layer. The method comprises interposing a silicon oxynitride layer between the FSG layer and the photoresist layer sufficiently to form a barrier for preventing said fluorine substance outflow and to form a dielectric ARC in underlying relation to the photoresist layer for suppressing said reflection of light waves.

The present invention also contemplates the product thereby produced.

The invention will be more readily understood from the following detailed description taken with the accompanying drawings and claims.

Figure 1A:
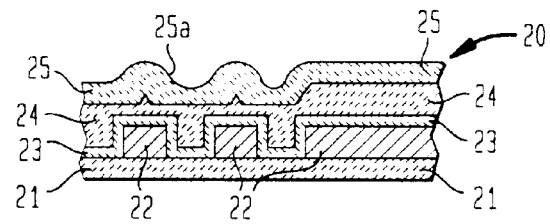
FIGS. 1A to 1G are a series of vertical cross sectional views illustrating stages in forming a patterned conductive layer on a semiconductor substrate in accordance with the PRIOR ART.

It is noted that the drawings are not to scale, some portions being shown exaggerated to make the drawings easier to understand.

DETAILED DESCRIPTION

Referring now to FIGS. 1A to 1G, there are shown stages of fabrication of a PRIOR ART semiconductor device or microchip 20 having variously a wafer substrate 21, a metal conductive layer 22, a silicon dioxide intermetal dielectric liner 23, a dielectric FSG layer 24, a FSG layer polished top surface 24b, a silicon dioxide dielectric cap layer 25, a silicon dioxide cap layer rough top surface 25a and polished top surface 25b, an additional silicon dioxide dielectric cap layer 26, an organic ARC layer 27, a photoresist layer 28, e.g., of positive photoresist material, a contact hole (aperture) 29, a deepened contact hole 29a and a via (aperture) 30.

FIGS. 1A to 1G illustrate a typical PRIOR ART method sequence of ten steps for forming a patterned conductive layer on a semiconductor substrate, using FSG as an IMD material.

FIG. 1A shows semiconductor device or microchip 20 having a wafer substrate 21 on which have been sequentially deposited by known PECVD technique a metal conductive layer 22, a silicon dioxide intermetal dielectric liner 23 for metal layer 22, a FSG layer 24 as a low dielectric material to separate neighboring levels of metallization, and a silicon dioxide dielectric cap layer 25 for dielectric FSG layer 24 as a topographically conformal covering and spacing material to fill in step unevenness and gaps, level off the surface of FSG layer 24 and partially reduce fluorine substance out diffusion (including out diffusion of fluorine itself) from FSG layer 24. At this point silicon dioxide cap layer 25, which serves as a planarizing layer, has a rough top surface 25a. This is the condition of semiconductor device 20 after the steps of (1) depositing and patterning metal layer 22 on substrate 21, (2) depositing silicon dioxide liner 23 on metal layer 22, (3) depositing FSG layer 24 on silicon dioxide liner 23, and (4) depositing silicon dioxide cap layer 25 on FSG layer 24.

Figure 1B:
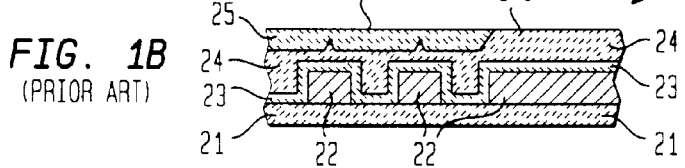

FIG. 1B shows semiconductor device 20 with rough top surface 25a and a portion of the upper course of silicon dioxide cap layer 25 removed to provide polished top surface 25b thereon flush with the adjacent top course of FSG layer 24 which is concomitantly provided with polished top surface 24b for planarizing purposes. This is the condition of semiconductor device 20 after the step of (5) chemical mechanical polishing (CMP) of silicon dioxide cap layer 25 and concomitantly of FSG layer 24.

Figure 1C:
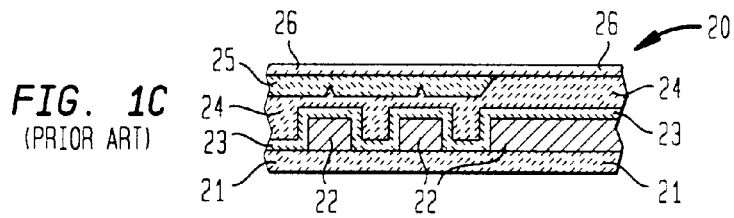

FIG. 1C shows semiconductor device 20 with additional post CMP silicon dioxide dielectric cap layer 26 on the corresponding polished top surface 25b of silicon dioxide cap layer 25 and concomitantly on polished top surface 24b of FSG layer 24. This is the condition of semiconductor device 20 after the step of (6) depositing post CMP additional silicon dioxide cap layer 26 on polished silicon dioxide cap layer 25 and concomitantly on polished FSG layer 24.

Figure 1D:
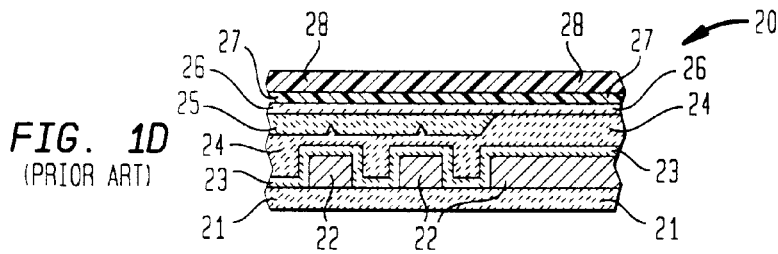

FIG. 1D shows semiconductor device 20 with organic ARC layer 27 on additional silicon dioxide cap layer 26 and photoresist layer 28, e.g., of positive photoresist material, on organic ARC layer 27, just prior to photolithographic exposure. This is the condition of semiconductor device 20 after the step of (7) depositing organic ARC layer 27 on additional post CMP silicon dioxide cap layer 26, and the first part of step (8), i.e., depositing photoresist layer 28 on organic ARC layer 27.

Figure 1E:
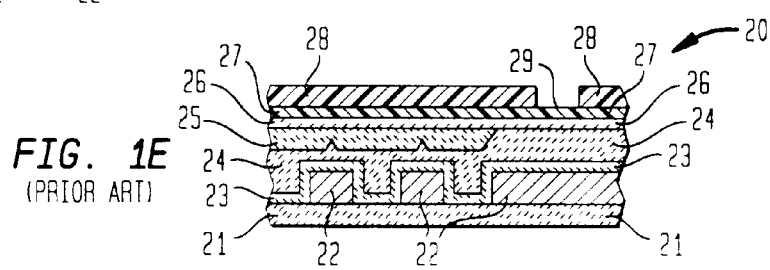

FIG. 1E shows semiconductor device 20 after photolithographic exposure of photoresist layer 28 through a patterned mask (not shown) and subsequent development in known manner, to form contact hole (aperture) 29. This is the condition of semiconductor device 20 after the remaining part of step (8), i.e., photolithographic exposure and development.

Figure 1F:
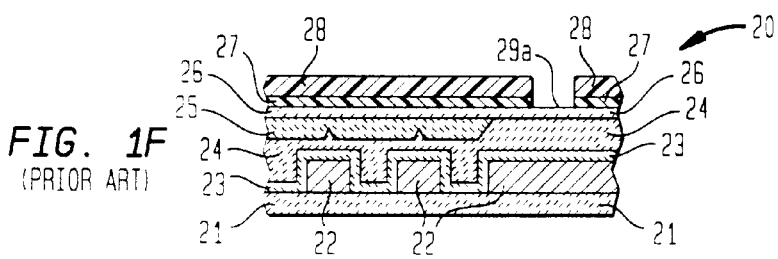

FIG. 1F shows semiconductor device 20 after the first etching step in which organic ARC layer 27 is subjected to an open etch to form deepened contact hole 29a. This is the condition of semiconductor device 20 after the step of (9) open etching of organic ARC layer 27.

Figure 1G:
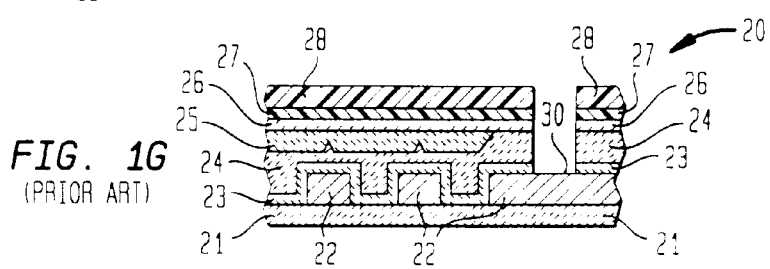

Lastly, FIG. 1G shows semiconductor device 20 after the second etching step in which the vicinal portions of additional silicon dioxide cap layer 26, silicon dioxide cap layer 25 (if any), FSG layer 24 and silicon dioxide liner 23 are subjected to contact etching to form via (aperture) 30 for exposing metal layer 22 for metallization and further processing. This is the condition of semiconductor device 20 after the final step of (10) contact etching the vicinal dielectric layers 26, 25 (if any), 24 and 23.

The steps of depositing on wafer substrate 21 of metal layer 22, silicon dioxide liner 23, FSG layer 24 and silicon dioxide cap layer 25, then polishing silicon dioxide cap layer 25 and FSG layer 24, and further depositing additional silicon dioxide cap layer 26, organic ARC layer 27, and photoresist layer 28, are effected by conventional technique. The further steps of photolithographically exposing and developing photoresist layer 28, etching organic ARC layer 27, and etching additional silicon dioxide cap layer 26, silicon dioxide cap layer 25 (where present), FSG layer 24 and silicon dioxide liner 23, to expose metal layer 22, are also effected by conventional technique.

Aside from the inadequacy of additional silicon dioxide cap layer 26 and silicon dioxide cap layer 25 to prevent out diffusion of fluorine substances from FSG layer 24, organic ARC layer 27 must be provided as a separate additional layer and the above discussed ten step prior art method requires two separate etching steps. This is because organic ARC layer 27 cannot be etched by the contact etch needed to etch silicon dioxide based dielectric layers 26, 25 (where present), 24 and 23. Conversely, silicon dioxide based dielectric layers 26, 25 (where present), 24 and 23 cannot be etched by the open etch needed to etch organic ARC layer 27. As demonstrated below, these prior art drawbacks are overcome by the system of the present invention.

According to the invention, the method of forming a patterned conductive layer on a semiconductor substrate contemplates the analogous eight steps of:

[1] providing a metal conductive layer on a surface of a semiconductor substrate (metal deposition and patterning);

[2] providing a silicon dioxide dielectric liner on the metal conductive layer;

[3] providing a FSG (fluorinated silicate glass) layer on the silicon dioxide dielectric liner;

[4] optionally providing a silicon dioxide dielectric cap layer on the FSG layer;

[5] effecting chemical mechanical polishing (CMP) of the silicon dioxide cap layer and concomitantly of the adjacent portions of the FSG layer;

[6] providing a post CMP silicon oxynitride cap layer on the polished silicon dioxide cap layer and concomitantly on the polished FSG layer and sufficiently to prevent fluorine substance outflow therethrough from the FSG layer and for forming an ARC (antireflective coating);

[7] providing a photoresist layer on the silicon oxynitride ARC layer and selectively photolithographically exposing and developing the photoresist layer to uncover selective pattern portions of the underlying silicon oxynitride ARC layer; and

[8] removing the uncovered pattern portions of the silicon oxynitride ARC layer and corresponding portions of the silicon dioxide cap layer (where present), FSG layer and silicon dioxide dielectric liner to expose pattern portions of the metal conductive layer, such as by contact etching in a single dry etching step.

Referring now to FIGS. 2A to 2F, there are shown stages of fabrication of a semiconductor device or microchip 40 according to an embodiment of the invention, having variously a wafer substrate 21', e.g., of silicon, a conductive layer 22', e.g., of a metal, an IMD (intermetal dielectric) liner 23', e.g., of silicon dioxide, a dielectric FSG (fluorinated silicate glass) layer 24', a FSG layer polished top surface 24b', a silicon dioxide cap layer 25', a silicon dioxide cap layer rough top surface 25a' and polished top surface 25b', a dielectric silicon oxynitride ARC cap layer 41, a photoresist layer 42, e.g., of positive photoresist material, a contact hole (aperture) 43, and a via (aperture) 44.

In FIGS. 2A to 2F, parts having prime (') designations are the same as those in FIGS. 1A to 1G.

FIGS. 2A to 2F illustrate a method sequence of eight steps for forming a patterned conductive layer on a semiconductor substrate, using FSG as an IMD material.

Figure 2A:
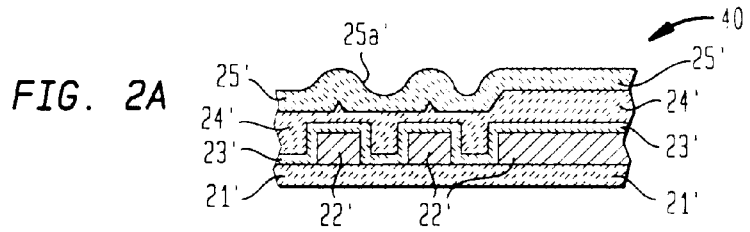
FIGS. 2A to 2F are a series of similar vertical cross sectional views illustrating stages in forming a patterned conductive layer on a semiconductor substrate in accordance with an embodiment of the invention.

FIG. 2A shows semiconductor device or microchip 40 having a wafer substrate 21' on which have been sequentially deposited by known PECVD technique a conductive layer 22', e.g., of a metal, an IMD (intermetal dielectric) liner 23', e.g., of silicon dioxide, for metal layer 22', a FSG layer 24' as a low dielectric material to separate neighboring levels of metallization, and a silicon dioxide cap layer 25' for FSG layer 24' as a topographically conformal covering and spacing material to fill in step unevenness and gaps, level off the surface of FSG layer 24' and partially reduce fluorine substance out diffusion from FSG layer 24'. At this point silicon dioxide cap layer 25', which serves as a planarizing layer, has a rough top surface 25a'. This is the condition of semiconductor device 40 after the steps of [1] depositing and patterning metal layer 22 on wafer substrate 21, [2] depositing silicon dioxide liner 23 on metal layer 22, [3] depositing FSG layer 24 on silicon dioxide liner 23, and [4]

depositing gap-filling and planarizing silicon dioxide cap layer 25 on FSG layer 24.

Figure 2B:
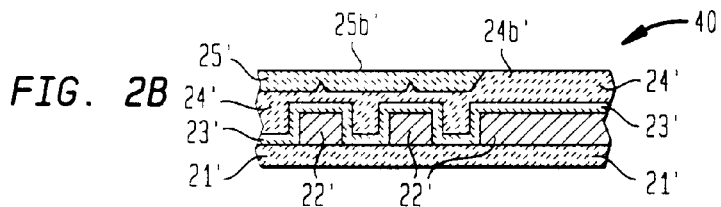

FIG. 2B shows semiconductor device 40 with rough top surface 25a' and a portion of the upper course of silicon dioxide cap layer 25' removed to provide polished top surface 25b' thereon flush with the adjacent top course of FSG layer 24' which is concomitantly provided with polished top surface 24b' for planarizing purposes. This is the condition of semiconductor device 40 after the step of [5] effecting chemical mechanical polishing (CMP) of silicon dioxide cap layer 25' and concomitantly of the adjacent portions of FSG layer 24'.

Figure 2C:
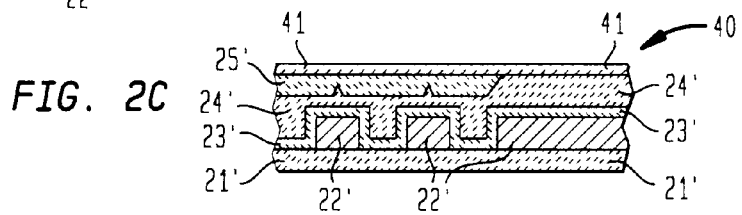

FIG. 2C shows semiconductor device 40 with a post CMP silicon oxynitride ARC cap layer 41 on the corresponding polished top surface 25b' of silicon dioxide cap layer 25' and concomitantly on polished top surface 24b' of FSG layer 24', and which is sufficient (i.e., in thickness and density) to prevent fluorine substance outflow therethrough from FSG layer 24' and for forming an ARC. This is the condition of semiconductor device 40 after the step of [6] depositing post CMP silicon oxynitride ARC cap layer 41 on polished silicon dioxide cap layer 25' and concomitantly on polished FSG layer 24'.

Figure 2D:
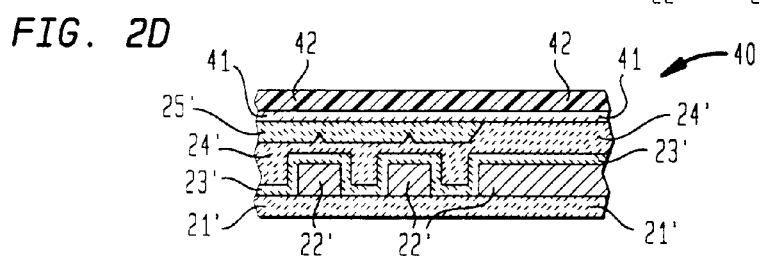

FIG. 2D shows semiconductor device 40 with photoresist layer 42, e.g., of positive photoresist material, on silicon oxynitride ARC layer 41, just prior to photolithographic exposure. This is the condition of semiconductor device 40 after the first part of step [7], i.e., depositing photoresist layer 42 on silicon oxynitride ARC layer 41.

Figure 2E:
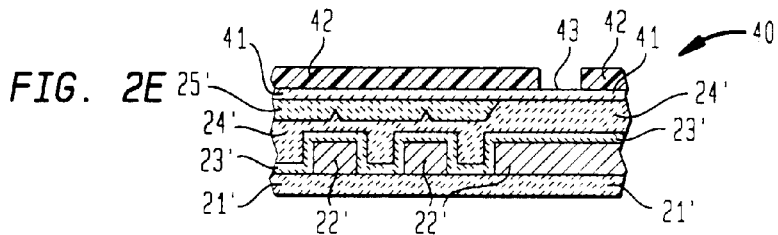

FIG. 2E shows semiconductor device 40 after photolithographic exposure of photoresist layer 42 through a patterned mask (not shown) and subsequent development in known manner, to form contact hole (aperture) 43. This is the condition of semiconductor device 40 after the remaining part of step [7], i.e., selective photolithographic exposure and development to uncover selective pattern portions of the underlying silicon oxynitride ARC layer 41.

Figure 2F:
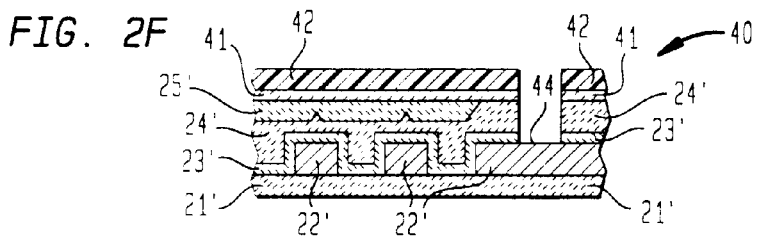

Lastly, FIG. 2F shows semiconductor device 40 after the single etching step in which the vicinal portions of silicon oxynitride ARC layer 41, silicon dioxide cap layer 25' (if any), FSG layer 24' and silicon dioxide liner 23' are subjected to contact etching to form via (aperture) 44 to expose metal layer 22' for metallization and further processing. This is the condition of semiconductor device 40 after the final step of [8] contact etching of the vicinal dielectric layers 41, 25' (where present), 24' and 23' to remove the uncovered pattern portions of silicon oxynitride ARC layer 41 and corresponding portions of silicon dioxide cap layer 25' (if any), FSG layer 24' and silicon dioxide liner 23' to expose patterned portions of metal layer 22. Such may be effected by contact etching in a single dry etching step, e.g., using $CF_4$ (tetrafluoromethane) and argon gas per RIE (reactive ion etching).

The steps of depositing on wafer substrate 21' of metal layer 22', silicon dioxide liner 23', FSG layer 24' and silicon dioxide cap layer 25', then polishing silicon dioxide cap layer 25' and concomitant portions of FSG layer 24', and further depositing silicon oxynitride ARC layer 41 and organic photoresist layer 42, are effected by conventional technique. The further steps of photolithographically exposing and developing photoresist layer 42, and then etching collectively dielectric silicon oxynitride ARC layer 41, silicon dioxide cap layer 25' (where present), FSG layer 24' and silicon dioxide liner 23' to expose metal layer 22', are also effected by conventional technique.

In particular, metal layer 22', silicon dioxide liner 23', FSG layer 24', silicon dioxide cap layer 25' and silicon oxynitride ARC layer 41 are typically provided by PECVD technique. FSG layer 24' can also be provided by HDP type CVD.

Preferably, metal layer 22' is provided in a thickness of about 1,000–10,000 angstroms, silicon dioxide liner 23' is provided in a thickness of about 100–2,000 angstroms, FSG layer 24' is provided in a thickness of about 1,000–10,000 angstroms, silicon dioxide cap layer 25' is provided in a thickness of up to about 20,000 angstroms (i.e., about 0–20,000 angstroms), and silicon oxynitride ARC layer 41 is provided in a thickness of about 100–2,000 angstroms.

Photoresist layer 42 is exposed to UV or visible light wave irradiation such as at a wavelength of about 193 to 633 nm. Desirably, silicon oxynitride ARC layer 41 has a refractive index of about 1.60–3.6 (real part) at said wavelength and an extinction coefficient of about 0.01 to 2.0 (imaginary part) at said wavelength.

It will be appreciated that because of the heavier density of silicon oxynitride compared to FSG, silicon oxynitride ARC layer 41 may be provided in a suitable thickness on FSG layer 24' to suppress out diffusion of fluorine substances (including fluorine itself and attendant self-generating contaminant compounds thereof with other contaminating precursor constituents) from FSG layer 24' to the interface with adjacent metal layers such as those applied during subsequent metallization operations. This will insure against metal layer peeling due to collection of fluorine and contaminant compounds thereof, out diffused from FSG layer 24' to a neighboring metal interface and acting as corroding or poisoning agents thereat.

The silicon oxynitride ARC layer thus achieves increased stability of the FSG layer for IMD application, compared to silicon dioxide, by providing a better protective diffusion barrier to outflow of fluorine substances from the underlying FSG layer, even when used in a layer thickness of only about 100–2,000 angstroms. This is due to the fact that silicon oxynitride is a much denser material than FSG. This effectively prevents metal peeling problems caused by fluorine substance out-gassing as encountered in the prior art.

It also inherently prevents such fluorine substance outflow from reaching the photoresist layer and poisoning such layer as well.

Also, because silicon oxynitride, as contemplated herein, is absorptive of light at all pertinent wavelengths, e.g., 193–633 nm, having a refractive index of 1.6–3.6 (real part) and an extinction coefficient of 0.01–2.0 (imaginary part) at 193–633 nm wavelength, it serves as an efficient in situ ARC for photoresist layer 42. Specifically, it promotes complete and uniform photolithographic exposure and development of the IC design pattern areas at high aspect ratios (depth to width) for producing photoresist footing-free and photoresist pinching-free profiles, i.e., essentially straight vertical walls in the etched areas.

The silicon oxynitride ARC layer thus simultaneously also achieves uniform reflectance control for contact photolithographic processing since it is an excellent antireflective material for both MUV (typically of 365 nm wavelength) and DUV (typically of 248 nm or less wavelength) photolithographic processing.

The silicon oxynitride composition can be adjusted to optimize its antireflective property by suitably changing the composition ratio of the $SiO_xN_y$ components, where x is 0.5–1.5 and y is 0.1–1.5, i.e., $SiO_{0.5-1.5}N_{0.1-1.5}$, for example, per PECVD using silane ($SiH_4$) with nitrous oxide ($N_2O$) or oxygen and nitrogen. More particularly, the silicon oxynitride comprises $SiO_{0.5-1.5}N_{0.1-1.5}$, and antireflective material of three phases including an amorphorous silicon phase, a silicon oxide phase, and a silicon nitride phase.

In particular, wafer substrate 21' may be made of silicon, or of another material such as a metal. Metal layer 22' is typically made of aluminum, tungsten or copper. Silicon dioxide liner 23' serves as an insulation barrier between metal layer 22' and FSG layer 24'. Silicon dioxide layer 25' is provided as a conventional spacing material to contribute thickness before planarizing polishing of FSG layer 24' such as by CMP to improve the flatness of FSG layer 24'. These materials are sufficiently refractory to withstand subsequent metallization and further processing at elevated temperatures of at least about 420° C.

As noted above, the ten step prior art method suffers from the disadvantages of inadequate suppression of fluorine substance out diffusion from FSG layer 24 using additional silicon dioxide cap layer 26, plus the need for an additional organic ARC layer 27 and for two incompatible etching steps, one for organic ARC layer 27 and the other for silicon dioxide based dielectric layers 26, 25 (where present), 24 and 23.

Because silicon oxynitride ARC layer 41 is a dielectric material like the dielectric material of silicon dioxide cap layer 25', FSG layer 24' and silicon dioxide liner 23', all of these layers may be etched collectively in a single etching step to expose metal layer 22' such as by contact etching using a dry etching step. Thus, the prior art method of providing a conventional ARC layer can be skipped because silicon oxynitride ARC layer 41 which serves as such ARC can be etched away using similar chemistry to silicon dioxide dielectric etching, enabling use of a single step contact etch process, which does not contemplate an ARC open etch process.

After the above eight step method according to the invention and ensuing metallization, the wafer substrate may undergo the back end of the line steps remaining between metallization and sale.

Figure 3:
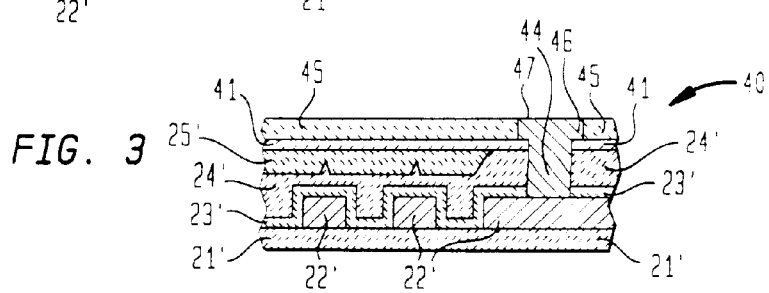
FIG. 3 is a similar vertical cross sectional view of the semiconductor substrate of FIGS. 2A to 2F after metallization.

For example, FIG. 3 shows semiconductor device 40 after stripping photoresist layer 42 (FIG. 2F), depositing a further insulation layer 45 on silicon oxynitride ARC layer 41, and etching a trench 46 in further insulation layer 45. This is followed by metallization to deposit a further (second level) conductive layer 47, e.g., of aluminum, tungsten or copper, such as in a layer thickness of about 1,000–10,000 angstroms, in trench 46 and in conductive contact with (first level) conductive layer 22' through via 44. All these steps are effected by conventional technique. It is noted that trench 46, which is defined in further insulation layer 45, and further conductive layer 47, which extends along trench 46, collectively run in a direction perpendicular to the plane of the paper of FIG. 3.

Thus, the combination of FSG layer 24' and silicon oxynitride ARC layer 41 provides semiconductor device 40 with an arrangement for preventing fluorine substance outflow from FSG layer 24' to further conductive layer 47 (FIG. 3) in accordance with the invention. At the same time, the combination of FSG layer 24' and silicon oxynitride ARC layer 41 forms an in situ ARC construction (FIG. 2C) for efficient sub-quarter micron photolithographic processing of semiconductor device 40 as generally described above in connection with FIGS. 2A to 2F.

Accordingly, it can be appreciated that the specific embodiments described are merely illustrative of the general principles of the invention. Various modifications may be provided consistent with the principles set forth.

What is claimed is:

1. A method of forming a patterned conductive layer on a semiconductor substrate comprising the steps of:

providing a conductive layer on a surface of a semiconductor substrate;

providing a dielectric liner on the conductive layer;

providing a fluorinated silicate glass layer on the dielectric liner;

providing a silicon oxynitride layer on the fluorinated silicate glass layer sufficiently to prevent fluorine substance outflow therethrough from the fluorinated silicate glass layer and for forming an antireflective coating;

providing a photoresist layer on the silicon oxynitride layer;

selectively exposing and developing the photoresist layer to uncover selective pattern portions of the underlying silicon oxynitride layer; and removing the uncovered pattern portions of the silicon oxynitride layer and corresponding underlying portions of the fluorinated silicate glass layer and dielectric liner to expose pattern portions of the conductive layer.

2. The method of claim 1 wherein the dielectric liner is formed of silicon dioxide.

3. The method of claim 1 wherein the uncovered pattern portions of the silicon oxynitride layer and corresponding underlying portions of the fluorinated silicate glass layer and dielectric liner are all removed together in an etching step.

4. The method of claim 1 including providing a dielectric cap layer between the fluorinated silicate glass layer and the silicon oxynitride layer.

5. The method of claim 4 wherein the dielectric cap layer is formed of silicon dioxide.

6. The method of claim 4 wherein the dielectric cap layer is provided in a thickness of up to about 20,000 angstroms.

7. The method of claim 4 wherein the dielectric cap layer is polished before the silicon oxynitride layer is provided thereon.

8. The method of claim 7 wherein the dielectric cap layer is polished by a chemical mechanical polishing step.

9. The method of claim 8 wherein the polished dielectric cap layer has a resultant thickness of about 0–20,000 angstroms.

10. The method of claim 4 wherein the uncovered pattern portions of the silicon oxynitride layer and corresponding underlying portions of the dielectric cap layer, fluorinated silicate glass layer and dielectric liner are all removed together in an etching step.

11. The method of claim 1 wherein the conductive layer is provided in a thickness of about 1,000–10,000 angstroms, the dielectric liner is provided in a thickness of about 100–2,000 angstroms, the fluorinated silicate glass layer is provided in a thickness of about 1,000–10,000 angstroms, and the silicon oxynitride layer is provided in a thickness of about 100–2,000 angstroms, and wherein the silicon oxynitride comprises $SiO_{0.5-1.5}N_{0.1-1.5}$.

12. The method of claim 1 wherein the photoresist layer is exposed to light irradiation at a wavelength of about 193–633 nm, and the silicon oxynitride layer has a refractive index of about 1.60–3.6 at said wavelength and an extinction coefficient of about 0.01–2.0 at said wavelength.

13. A method of forming a patterned conductive metal layer on a surface of a semiconductor substrate comprising the steps of:

providing a conductive metal layer on a surface of a semiconductor substrate;

providing a dielectric silicon dioxide liner on the conductive layer;

providing a fluorinated silicate glass layer on the dielectric liner;

providing a dielectric silicon dioxide cap layer on the fluorinated silicate glass layer;

providing a silicon oxynitride layer on the dielectric cap layer and in overlying relation to the fluorinated silicate glass layer sufficiently to prevent fluorine substance outflow therethrough from the fluorinated silicate glass layer and for forming an antireflective coating;

providing a photoresist layer on the silicon oxynitride layer;

selectively exposing and developing the photoresist layer to uncover selective pattern portions of the underlying silicon oxynitride layer; and collectively removing together the uncovered pattern portions of the silicon oxynitride layer and corresponding underlying portions of the dielectric cap layer, fluorinated silicate glass layer and dielectric liner in a single etching step to expose pattern portions of the conductive layer.

14. The method of claim 13 wherein the dielectric cap layer is polished by a chemical mechanical polishing step before the silicon oxynitride layer is provided thereon.

15. A method of treating a wafer substrate in semiconductor fabrication for preventing fluorine substance outflow from a fluorinated silicate glass layer thereon to an overlying photoresist layer and simultaneously for suppressing reflection of light waves back into the photoresist layer during photolithographic processing of the photoresist layer to maximize uniformity of patterned light wave exposure and development of the photoresist layer, which comprises interposing a silicon oxynitride layer between the fluorinated silicate glass layer and the photoresist layer sufficiently to form a barrier for preventing said fluorine substance outflow and to form a dielectric antireflective coating in underlying relation to the photoresist layer for suppressing said reflection of light waves.

16. The method of claim 15 wherein the silicon oxynitride comprises $SiO_{0.5-1.5}N_{0.1-1.5}$.

* * * * *